United States Patent
Milanese et al.

(10) Patent No.: US 6,229,346 B1
(45) Date of Patent: May 8, 2001

(54) HIGH FREQUENCY SUPPLY COMPATIBLE HYSTERESIS COMPARATOR WITH LOW DYNAMICS DIFFERENTIAL INPUT

(75) Inventors: Carlo Maria Milanese, Olevano di Lomellina; Rinaldo Castello, Arcore, both of (IT)

(73) Assignee: STMicroelectronics S.r.L., Agrate Brianza (IT)

(*) Notice: Subject to any disclaimer, the term of this patent is extended or adjusted under 35 U.S.C. 154(b) by 0 days.

(21) Appl. No.: 09/510,323

(22) Filed: Feb. 22, 2000

(30) Foreign Application Priority Data

Feb. 22, 1999 (IT) .............................................. VA99A0005

(51) Int. Cl.$^7$ ..................................................... H03K 5/22
(52) U.S. Cl. .................................. 327/65; 327/66; 327/89
(58) Field of Search ..................................... 327/52, 53, 54, 327/58, 62, 63, 65, 66, 67, 77, 87, 89

(56) References Cited

U.S. PATENT DOCUMENTS 5,587,674 * 12/1996 Danstrom ................................ 327/67
5,894,234 * 4/1999 Morris ..................................... 327/65
6,064,240 * 5/2000 Wachter ................................... 327/66

* cited by examiner

Primary Examiner—Tuan T. Lam
Assistant Examiner—Hiep Nguyen
(74) Attorney, Agent, or Firm—Theodore E. Galanthay; Allen, Dyer, Doppelt, Milbrath & Gilchrist, P.A.

(57) ABSTRACT

A comparator circuit includes a differential input stage, a second differential stage having a differential output, and an output stage transforming an output signal from the differential output of the second differential stage into an output signal having a logic level. The comparator further includes a common mode measuring stage. The common mode measuring stage includes a differential pair of input transistors and a differential pair of complementary transistors biased by respective current generators, and a current mirror summing the differential output currents of the two complementary transistors pairs into a single output current signal. A switching stage is controlled by the differential output nodes of the second differential stage. A common source node of the switch stage is coupled to the output of the common mode measuring stage and to the differential output nodes of the differential input stage.

25 Claims, 2 Drawing Sheets

Vi: DIFFERENTIAL INPUT VOLTAGE
Vo: OUTPUT VALUE
Vhys: HYSTERESIS VOLTAGE $VO = VPOS$ se $Vx > Vin$
$VO = VNEG$ se $Vx < Vin$
$Vhys = (VPOS-VNEG) \cdot R1/(R1+R2)$

HIGH FREQUENCY SUPPLY COMPATIBLE HYSTERESIS COMPARATOR WITH LOW DYNAMICS DIFFERENTIAL INPUT

Field of the Invention

The present invention relates to receivers, and, more particularly, to a comparator within a receiver. The receiver is compliant to the specifications defined by IEEE P1596.3-1995 Draft 1.3 standard.

BACKGROUND OF THE INVENTION

The IEEE P1596.3-1995 Draft 1.3 standard relates to the transmission of digital signals (bits) in a differential form using as a transmission medium two transmission lines adapted with 100 ohm impedance differentials. The transmission medium may be a pair of metal lines on a printed circuit board (PCB) of a personal computer, for example. The digital signals have a limited dynamic range, typically with a peak of 400 mV, for example. In general, the standard relates to high frequency signals up to 500 Mbit/s. The use of limited dynamic range signals minimizes the current consumption of the transmitter and allows for a high bit-rate.

The choice of differential signals reduces the noise generated in transmission. In fact, equal and opposite currents on two parallel tracks tend to minimize electromagnetic interferences (EMI). The differential signals also increase immunity to noise from other parts of the system, such as noise of a common mode type.

Compatibility with large common mode signals is required in the receiver defined by the above cited standard to ensure correct operation of the connection even in the presence of large noise levels on the local grounds of the transmitter and the receiver.

The receiver requirements are as follows:
(1) the input band is up to 500 MHz; (2) the minimum input amplitude has a 100 mV differential peak; (3) the common mode dynamic amplitude of the inputs is 0–2.4 V with a 3 V supply; and (4) the hysteresis is 25 mV at a minimum. Comparator structures satisfying one or more of these requirements are well known.

Requirements 1 and 2. Recently, high frequency and high sensitive comparator structures intended for Flash converters have been disclosed, for example. Such well known structures include several low gain amplification stages. However, they are synchronous structures, do not have hysteresis, and they are not "supply compatible".

Requirement 3. An input compatible common mode amplitude is dictated by the input circuit. There are several known circuits for operational amplifiers and comparators with a rail-to-rail compatible input. However, the hysteresis value tends to vary according to the input common mode unless gain compensation techniques for the input stage are used.

Requirement 4. Classic hysteresis comparators are well known and depicted in FIG. 2a and FIG. 2b with reference to the variables defined in FIG. 1. Both circuits are not appropriate for high frequencies. Moreover, in the case of the circuit of FIG. 2a, the value of the hysteresis depends on the voltage supply, while the circuit of FIG. 2b is not rail-to-rail compatible.

SUMMARY OF THE INVENTION

It is an object of the present invention to provide a comparator satisfying all the above indicated requirements. This object is fully attained by a comparator circuit comprising an input differential stage being supply voltage compatible, a second differential stage with a differential output, and an output stage transforming the differential output value of the second differential stage into a single logic level signal (single-ended). Moreover, the comparator comprises a common mode measuring stage that measures the input common mode, and has a structure similar to that of the input differential stage. The components of the common mode measuring stage are appropriately scaled in size for functioning under the same bias conditions as the input differential stage.

A measured common mode output signal from the single-ended common mode measuring stage is summed with a switch to one or the other output nodes of the input differential stage. The current switched on one or the other differential output nodes of the input differential stage establishes effectively the hysteresis value of the comparator throughout the whole dynamic range of the input common mode signals.

BRIEF DESCRIPTION OF THE DRAWINGS

The different aspects and advantages of the circuit of the invention will be more evident through the following description of an embodiment and by referring to the annexed drawings, in which.

DETAILED DESCRIPTION OF THE PREFERRED EMBODIMENTS

Figure 1:
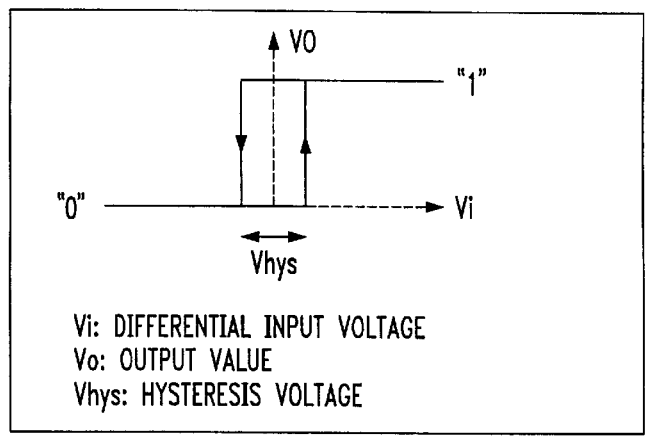
FIG. 1 is a diagram showing a hysteresis signal according to the prior art.
Figure 2:
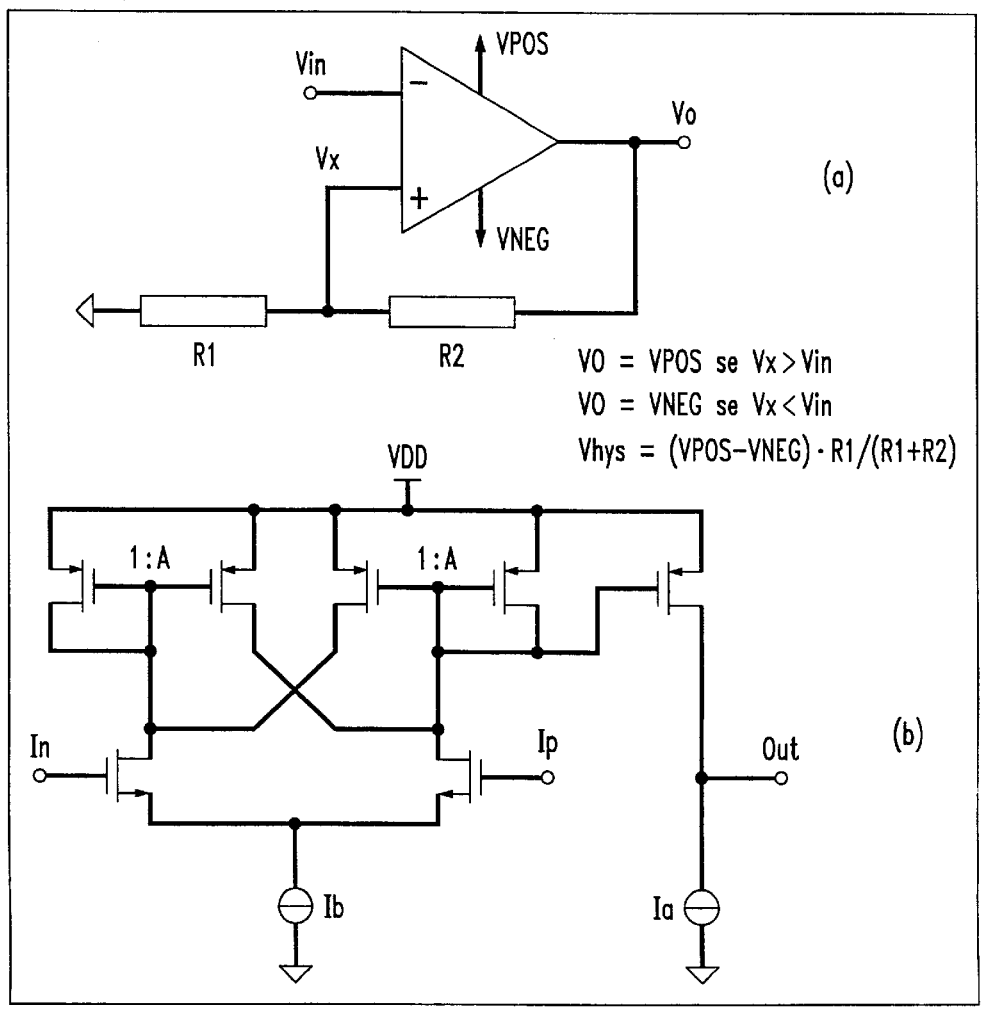
FIG. 2 shows two classic comparator circuits according to the prior art.
Figure 3:
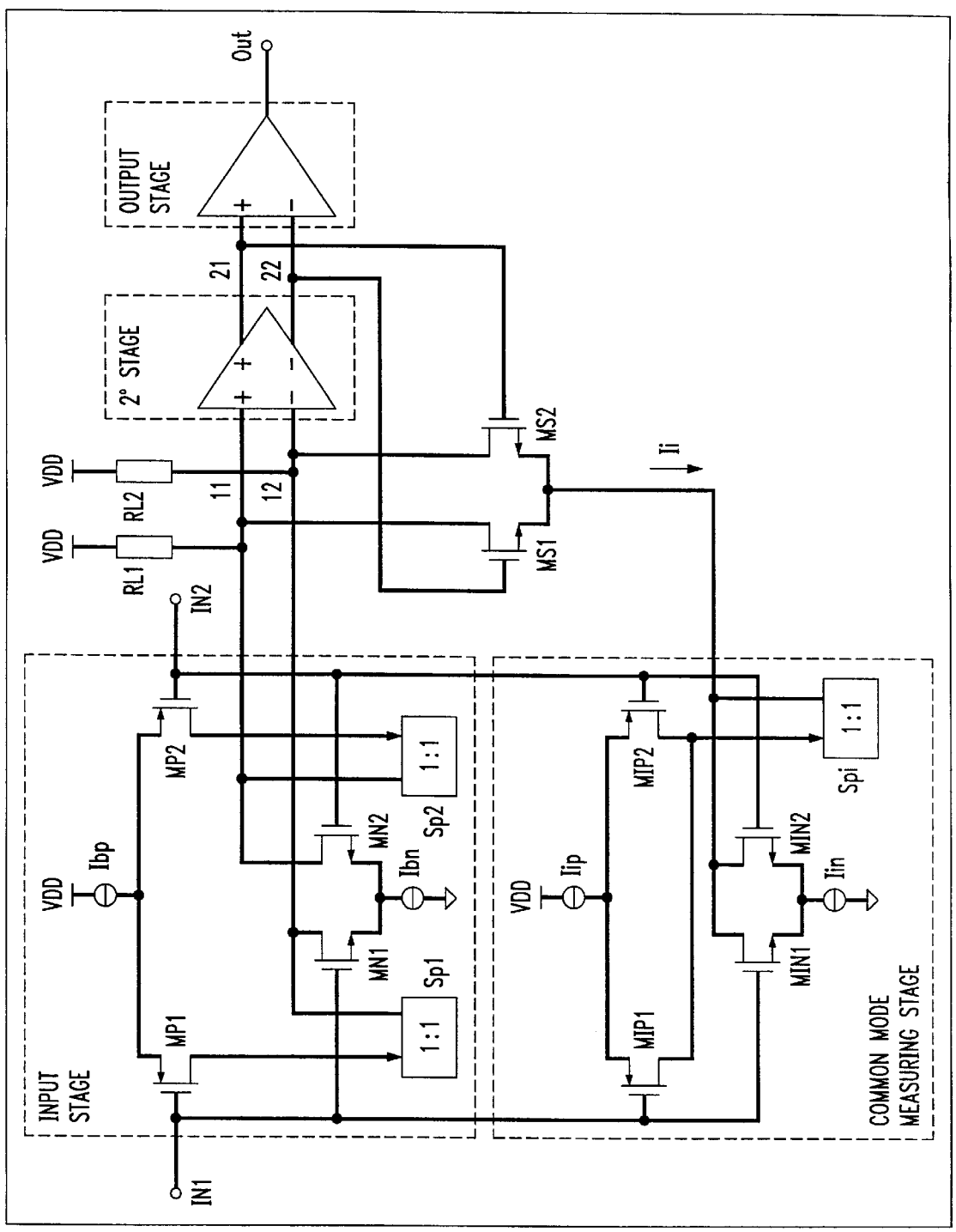
FIG. 3 is a circuit diagram of an embodiment of the comparator according to the present invention.

With reference to FIG. 3, the comparator of the invention comprises the following functional blocks. A supply compatible differential input stage, including a differential pair of NMOS transistors MN1, MN2 and a differential pair of PMOS transistors MP1, MP2. The differential pair of PMOS transistors MP1, MP2 are biased by the respective current generators Ibp and Ibn.

The output currents of the differential pair of ground compatible PMOS transistors are mirrored by the respective two current mirrors Sp1 and Sp2. The output currents are summed with the respective output currents of the differential pair of NMOS transistors on the respective two load resistances RL1 and RL2. These load resistances are connected to the output nodes 11 and 12.

The resistance values RL1=RL2=RL are chosen so that the total gain of the input stage is relatively low, e.g., between 3 and 10, under the different operating conditions that may be expected. A second differential stage includes a differential output having a relatively low gain. An output stage transforms the differential value present on the output nodes 21 and 22 of the second stage to a logic value compatible with CMOS levels, for example.

A common mode measuring stage includes a differential pair of NMOS transistors MIN1, MIN2 and a differential pair of PMOS transistor MIP1, MIP2 biased by Iin and Iip, respectively, and a current mirror (Spi). The transistors of the two differential pairs have their sources and drains shorted for only sensing the common mode portion of the input signal.

The dimensions of the transistors and the current generators are scaled with respect to those of the corresponding transistors and current generators of the input stage in order to make the corresponding transistors of the two stages operate under equivalent biasing conditions.

Only by way of an example, the ratios may follow the following rules:

same gate length for all transistors;
gate width W:
W(MP1)=Ap*W(MIP1)=W(MP2)=Ap*W(MIP2);
W(MN1)=An*W(MIN1)=W(MN2)=An*W(MIN2):
AN, Ap>>1 ;
biasing current: Ibp=Ap*Iip; Ibn=An*Iin.

A switching stage switches the output current of the common mode measuring stage on the respective output node of the input differential stage. The output current of this stage, switched by the differential pair MS1, MS2 establishes the hysteresis value of the comparator.

Let us suppose that the input signal has a common mode 0. In these conditions the transistors MN1 and MN2, MIN1 and MIN2 are OFF, the small signal gain of the input stage is gmp*RL (where gmp is the transconductance of MP1= MP"), and the current Ii is equal to Iip. If the voltage In1 is greater than IN2, the voltage on the node 11 is greater than that on node 12. Similarly, the voltage on the node 21 is greater than on the node 22. Therefore, MS2 is ON and MS1 is OFF.

The current Ii is injected through RL2 inducing a voltage drop of Ii*RL Volt on 12, which confirms the state of the circuit. In fact, a circuit portion, formed by the second stage 2°Stage and MS1, MS2 with RL1 and RL2 is latched with positive feedback. According to the way the output stage is connected, its output will be "1".

Applying to IN1 and IN2 a differential signal Vs, the switching of the comparator occurs when the voltage on node 12 attains and exceeds the voltage on node 11, i.e., if:

$$gmp*RL*Vs+RL*Iip>=0==>Vs=-Iip/gmp \quad (1)$$

The relation (1) is valid for Vs lower than the overdrive voltage Vov=(Vgs-Vth) of the input transistors. Such a relation can be ensured for hysteresis values on the order of tens of mV. If Vs>-Iip/gmp, the output Out becomes "0". The inverse switching is obtained when Vs'=Iip/gmp. The hysteresis value Vhys is thus 2*Iip/gmp. Since gm~2*Idrain/Vov, it may be said that Vhys=Vov(p)/Ap.

If the common mode voltage is close to the supply voltage VDD, the transistors MP1, MP2, MIP1, and MIP2 are OFF, the gain of the input stage is gmn*RL and Ii is the same as Iin. The hysteresis is 2*Iin/gmn=Vov(n)/An, where gmn is the transconductance of MN1=MN2.

For intermediate voltages all transistors are ON, the gain of the input stage is (gmn+gmp)*RL, Ii=(Iip+Iin) and the hysteresis values is 2*(Iin+Iip)/(gmn+gmp). By properly choosing the value of the biasing currents Ibn and Ibp, such that Von/An and Vonp/Ap are equal to the desired hysteresis value, it is ensured that the hysteresis will remains constant for the full common mode range of the comparator.

What is claimed is:

1. A comparator circuit comprising:
   a differential input stage comprising transistors;
   a second differential stage connected to said differential input stage and having a differential output;
   an output stage connected to the differential output of said second differential stage for transforming a differential output signal therefrom into a single ended output signal having a logic level;
   a common mode measuring stage comprising
   a pair of current generators,
   a differential pair of input transistors and a differential pair of complementary transistors biased by said pair of current generators, and
   a current mirror summing differential output currents of said differential pair of input transistors and said differential pair; and
   a switching stage comprising a differential pair of transistors respectively controlled by the differential output of said second differential stage, the differential pair of transistors each comprising a common source coupled to the output of said common mode measuring stage and respective drains coupled to differential output nodes of said differential input stage;
   the transistors of said differential input stage and said common mode measuring stage operating under the same bias conditions.

2. A comparator according to claim 1, wherein said differential input stage further comprises at least one current generator; and wherein size of the transistors and current generators of said differential input stage and said common mode measuring stage are scaled so that the transistors therein operate under the same bias conditions.

3. A comparator according to claim 1, wherein said differential input stage comprises:
   at least one current generator;
   a differential pair of input transistors and a differential pair of complementary transistors biased by said at least one current generator; and
   two current mirrors respectively mirroring output currents of said differential pair of complementary transistors.

4. A comparator according to claim 3, further comprising two load resistances respectively receiving the output currents of said differential pair of complementary transistors summed with output currents of said differential pair of input transistors.

5. A comparator according to claim 1, wherein the transistors are CMOS transistors.

6. A comparator circuit comprising:
   a differential input stage comprising transistors;
   a second differential stage connected to said differential input stage and having a differential output;
   an output stage connected to the differential output of said second differential stage for transforming a differential output signal therefrom into a single ended output signal;
   a common mode measuring stage comprising
   a pair of current generators,
   a differential pair of input transistors and a differential pair of complementary transistors biased by said pair of current generators, and
   a current mirror connected to said differential pair of input transistors and said differential pair of complementary transistors; and
   a switching stage connected to the output of said common mode measuring stage and to differential output nodes of said differential input stage for providing hysteresis;
   the transistors of said differential input stage and said common mode measuring stage operating under the same bias conditions to define a desired hysteresis value of the single ended output signal from said output stage.

7. A comparator according to claim 6, wherein said current mirror sums differential output currents of said differential pair of input transistors and said differential pair of complementary transistors.

8. A comparator according to claim 6, wherein said switching stage comprises a differential pair of transistors respectively controlled by the differential output of said second stage, and each transistor comprises a common source coupled to the output of said common mode measuring stage, and respective drains coupled to differential output nodes of said differential input stage.

9. A comparator according to claim 6, wherein said differential input stage further comprises at least one current generator; and wherein size of the transistors and current generators of said differential input stage and said common mode measuring stage are scaled so that the transistors therein operate under the same bias conditions.

10. A comparator according to claim 6, wherein said differential input stage comprises:
   at least one current generator;
   a differential pair of input transistors and a differential pair of complementary transistors biased by said at least one current generator; and
   two current mirrors respectively mirroring output currents of said differential pair of complementary transistors.

11. A comparator according to claim 10, further comprising two load resistances respectively receiving the output currents of said differential pair of complementary transistors summed with output currents of said differential pair of input transistors.

12. A comparator according to claim 6, wherein the transistors are CMOS transistors.

13. A transmission system receiver for digital signals in differential form comprising:
   a comparator comprising
      a differential input stage having an input for receiving the digital signals, and comprising transistors,
      a second differential stage connected to said differential input stage and having a differential output,
   an output stage connected to the differential output of said second differential stage for transforming a differential output signal therefrom into a single ended output signal,
   a common mode measuring stage comprising
      a pair of current generators,
      a differential pair of input transistors and a differential pair of complementary transistors biased by said pair of current generators, and
      a current mirror connected to said differential pair of input transistors and said differential pair of complementary transistors, and
   a switching stage connected to the output of said common mode measuring stage and to differential output nodes of said differential input stage for providing hysteresis,
   the transistors of said differential input stage and said common mode measuring stage operating under the same bias conditions to define a desired hysteresis value of the single ended output signal from said output stage.

14. A transmission system receiver according to claim 13, wherein said current mirror sums differential output currents of said differential pair of input transistors and said differential pair of complementary transistors.

15. A transmission system receiver according to claim 13, wherein said switching stage comprises a differential pair of transistors respectively controlled by the differential output of said second stage, and each transistor comprises a common source coupled to the output of said common mode measuring stage, and respective drains coupled to differential output nodes of said differential input stage.

16. A transmission system receiver according to claim 13, wherein said differential input circuit further comprises at least one current generator; and wherein size of the transistors and current generators of said differential input stage and said common mode measuring stage are scaled so that the transistors therein operate under the same bias conditions.

17. A transmission system receiver according to claim 13, wherein said differential input stage comprises:
   at least one current generator;
   a differential pair of input transistors and a differential pair of complementary transistors biased by said at least one current generator; and
   two current mirrors respectively mirroring output currents of said differential pair of complementary transistors.

18. A transmission system receiver according to claim 17, further comprising two load resistances respectively receiving the output currents of said differential pair of complementary transistors summed with output currents of said differential pair of input transistors.

19. A transmission system receiver according to claim 13, wherein the transistors are CMOS transistors.

20. A transmission system receiver according to claim 13, wherein the digital signals are compliant to specifications defined by the IEEE P1596.3-1995, Draft 1.3 standard.

21. A method for comparing signals using a comparator circuit comprising a differential input stage comprising transistors, a second differential stage connected to the differential input stage and having a differential output, and an output stage connected to the differential output of the second differential stage, the method comprising the steps of:
   transforming a differential output signal from the output stage into a single ended output signal;
   generating a single output current signal at an output of a common mode measuring stage comprising a pair of current generators, a differential pair of input transistors and a differential pair of complementary transistors biased by the pair of current generators, and a current mirror connected to the differential pair of input transistors and the differential pair of complementary transistors; and
   generating hysteresis in the single output current signal using a switching stage connected to the output of the common mode measuring stage and to differential output nodes of the differential input stage;
   operating the transistors of the differential input stage and the common mode measuring stage under the same bias conditions to define a desired hysteresis value of the single ended output signal from the output stage.

22. A method according to claim 21, differential output currents of the differential pair of input transistors and the differential pair of complementary, transistors are summed using the current mirror.

23. A method according to claim 21, wherein the switching stage comprises a differential pair of transistors respectively controlled by the differential output of the second differential stage, and each transistor comprises a common source coupled to the output of the common mode measuring stage, and respective drains coupled to differential output nodes of the differential input stage.

24. A method according to claim 21, wherein the differential input circuit further comprises at least one current generator; and wherein size of the transistors and current generators of the differential input stage and the common mode measuring stage are scaled so that the transistors therein operate under the same bias conditions.

25. A method according to claim 21, wherein the transistors are CMOS transistors.

* * * * *

UNITED STATES PATENT AND TRADEMARK OFFICE
CERTIFICATE OF CORRECTION

PATENT NO. : 6,229,346 B1
DATED : May 8, 2001
INVENTOR(S) : Carlo Maria Milanese, Rinaldo Castello It is certified that error appears in the above-identified patent and that said Letters Patent is hereby corrected as shown below:

Column 6,
Lines 15 and 16, delete "summed with output current of said differential pair of input transistors."
Line 49, delete "complementary, transistors" insert -- complementary transistors --

Signed and Sealed this

Fifth Day of March, 2002

Attest:

JAMES E. ROGAN
Attesting Officer
Director of the United States Patent and Trademark Office